US008693262B2

(12) United States Patent
Sullivan

(10) Patent No.: US 8,693,262 B2
(45) Date of Patent: Apr. 8, 2014

(54) REDUCED LATENCY MEMORY COLUMN REDUNDANCY REPAIR

(75) Inventor: Steven C. Sullivan, Austin, TX (US)

(73) Assignee: Apple Inc., Cupertino, CA (US)

( * ) Notice: Subject to any disclaimer, the term of this patent is extended or adjusted under 35 U.S.C. 154(b) by 217 days.

(21) Appl. No.: 13/270,653

(22) Filed: Oct. 11, 2011

(65) Prior Publication Data

US 2013/0091329 A1   Apr. 11, 2013

(51) Int. Cl.
*G11C 7/00*   (2006.01)

(52) U.S. Cl.
USPC .................................................. 365/189.02

(58) Field of Classification Search
USPC .......... 365/200, 201, 226, 225.7, 51, 189.09, 365/189.02, 185.09, 185.11, 185.05, 365/185.22, 205, 207, 230.03, 230.05
See application file for complete search history.

(56) References Cited

U.S. PATENT DOCUMENTS

| 7,362,629 | B2 | 4/2008 | Lee |
| 7,643,362 | B2 | 1/2010 | Nagashima |
| 7,706,202 | B2 | 4/2010 | Obayashi |
| 7,729,160 | B2 | 6/2010 | Choi |
| 2010/0246298 | A1 * | 9/2010 | Zhang et al. .................. 365/200 |

* cited by examiner

*Primary Examiner* — Harry W Byrne
(74) *Attorney, Agent, or Firm* — Stephen J. Curran; Meyertons, Hood, Kivlin, Kowert & Goetzel. P.C.

(57) ABSTRACT

A memory column redundancy mechanism includes a memory having a number of data output ports each configured to output one data bit of a data element. The memory also includes a number of memory columns each connected to a corresponding respective data port. Each memory column includes a plurality of bit cells that are coupled to a corresponding sense amplifier that may differentially output a respective data bit from the plurality of bit cells on an output signal and a complemented output signal. The memory further includes an output selection unit that may select as the output data bit for a given data output port, one of the output signal of the sense amplifier associated with the given data output port or the complemented output signal of the sense amplifier associated with an adjacent data output port dependent upon a respective shift signal for each memory column.

22 Claims, 6 Drawing Sheets

REDUCED LATENCY MEMORY COLUMN REDUNDANCY REPAIR

BACKGROUND

1. Technical Field

This disclosure relates to memory circuit repair, and more particularly to column redundancy repairs.

2. Description of the Related Art

Most memory circuits today implement some type of redundant circuit to repair cells and or logic that fails during manufacturing, or even during operation. Although there is a cost associated with adding the redundant logic, the benefits typically outweigh the cost because as device geometries continue to shrink, the number of defects introduced during manufacturing continues to increase. Accordingly, the cost of the redundant logic is small when compared to the cost of having to discard a device due to a memory failure. This may be especially true when the memory is embedded within a system on a chip (SOC), for example.

Although redundant memory circuits are beneficial, there are sometimes other drawbacks associated with these circuits. For example, in many cases, when a redundant circuit is switched in to repair the damaged circuit, additional delays may sometimes be introduced to the memory critical path. These additional delays may become unacceptable in some instances.

SUMMARY OF THE EMBODIMENTS

Various embodiments of a mechanism for implementing a reduced latency memory column redundancy repair are disclosed. Broadly speaking, a mechanism for repairing memory columns includes reducing output latency by using both outputs of a sense amplifier and selecting one of the outputs based upon repair information. Many conventional memory circuits use a differential sense amplifier that is connected in a single-ended configuration in which only one of the sense amplifier outputs is used. To preserve balanced sense amplifier output loading, the unused sense amplifier output is typically connected to one or more dummy devices having a capacitive load that is similar to the output that is being used. Accordingly, by recognizing that since there are already components connected to the unused output, the unused output for each column may be used with very little area penalty. Selection logic may select which of the sense amplifier outputs to use based upon whether or not that column output is being shifted to an adjacent column output during a repair. More particularly, by selecting the normal output when there is no shift, and selecting the complemented output during a shift, the critical path timing may be reduced.

In one embodiment, a memory includes a number of data output ports each configured to output one data bit of a data element such as a data word, for example. The memory also includes a number of memory columns each connected to a corresponding respective data port. Each memory column includes a plurality of bit cells that are coupled to a corresponding sense amplifier that may differentially output a respective data bit from the plurality of bit cells on an output signal and a complemented output signal. The memory further includes an output selection unit that may select as the output data bit for a given data output port, one of the output signal of the sense amplifier associated with the given data output port or the complemented output signal of the sense amplifier associated with an adjacent data output port dependent upon a respective shift signal for each memory column.

In one specific implementation, the memory may also include a number of data inversion circuits, each coupled to a respective bit cell of each memory column. Each data inversion circuit may invert a polarity of the data bit written to the respective bit cell in response to receiving an asserted shift signal.

Figure 1:
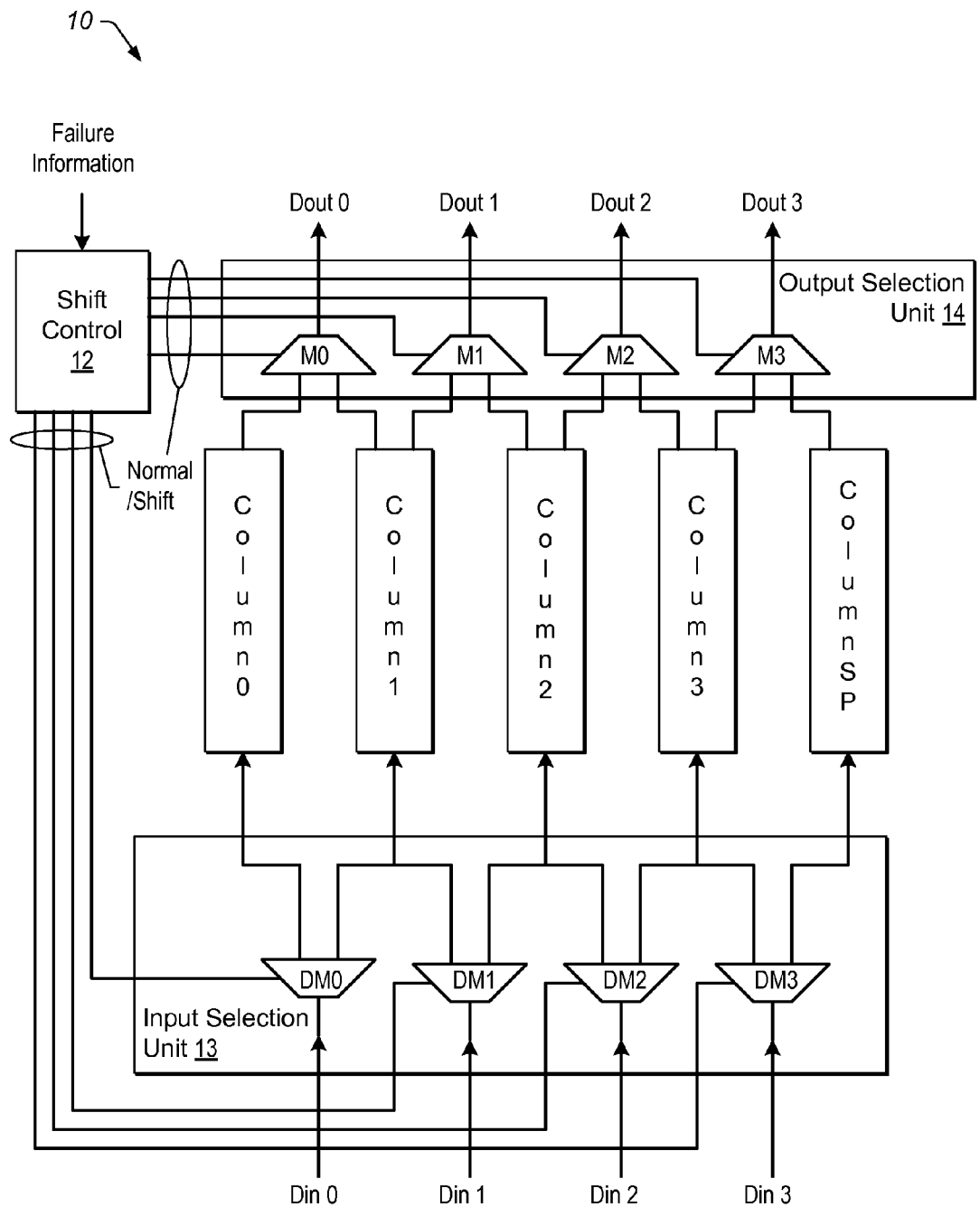
FIG. 1 is a block diagram of one embodiment of a memory including a memory column redundancy repair mechanism.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a memory including a memory column redundancy repair mechanism is shown. The memory 10 includes a number of memory columns designated column 0 through column 3 and a redundant memory column designated column SP. The memory columns are coupled to an output selection unit 14, which includes multiplexers (mux) M0 though M3, and an input selection unit 13, which includes demultiplexers (de-mux) DM0 though DM3. Specifically, column 0 and column 1 are coupled to mux M0 and demus DM0, column 1 and column 2 are coupled to mux M1 and demux DM1, column 2 and column 3 are coupled to mux M2 and demux DM2, an column 3 and column SP are coupled to mux M3 and demux DM3. A shift control unit 12 is also coupled to both the muxes M0 through M3, and the demuxes DM0 through DM3. Each mux is also coupled to a respective data output port, designated Dout0 through Dout3, while each demux is coupled to a respective data input port, designated Din0 through Din3. It is noted that although only four columns and a spare column are shown, it is contemplated that other embodiments may include any number of columns.

In one embodiment, the memory 10 may be representative of any device in the static random access memory (SRAM) family of devices. As such, the memory 10 may include other components and signals that have been omitted here for brevity. For example, each of the memory columns 0-SP may include a number of bit cells to store data, as well as sense amplifiers to output the data in the bit cells. In addition, there are a number of address and control signals that are not shown, such as row address signals, word lines, write enables, and the like.

The redundant memory column SP is a spare memory column that is not typically used under normal operating conditions in which there are no repairable defects in the memory array. However, as described above, if one or more bits in a given column are found to be defective and failing, the redundant memory column may be used and the defective failing memory column may be de-selected using the muxes and demuxes as described below.

In one embodiment, defective bit cells may be discovered through a variety of testing mechanisms. Once discovered, the address of the failing bits may be saved. For example, and in some instances fuses may be blown or the addresses may be stored in registers during built-in self-test. Regardless of the detection mechanism, the failure information may be provided to the shift control circuit 12. The shift control unit 12 may decode the failure information and generate appropriate normal/shift signals for selecting the mux and outputs and demux inputs. For example, if column 1 were found to have defective bit cells and the failure information is decoded to indicate that, the shift control unit 12 would assert a shift signal to mux M1, M2, and M3, as well as demux DM1, DM2, and DM3. The shift control unit 12 would not assert the shift signal for mux M0 and demux DM0, since there is nothing wrong with column 0. By asserting the shift signal for mux M1, the output of column 2 is provided to Dout1 through mux M1, the output of column 3 is provided to Dout2 through mux M2, and the output of column SP is provided to Dout3 through mux M3. However, the output of column 0 is still provided to Dout1 through mux M0. In addition, similar demultiplexing and normal/shift signaling may also be used on the inputs to the columns during write operations. More particularly, in this example, the data that was written to column 1 would now be written to column 2, the data that was written to column 2 would now be written to column 3, and the data that was written to column 3 would now be written to column SP.

As described in greater detail below in conjunction with the description of FIG. 3 and FIG. 4, the sense amplifiers included in each of the column output circuits utilize both the differential outputs, even though the output data is single-ended. In addition, the output selection unit 14 may select which of the differential outputs to use dependent upon the Shift signal. However, before the embodiment of FIG. 3 is described in detail, a description of a conventional memory column redundancy repair is given in reference to the embodiment of FIG. 2.

Figure 2:
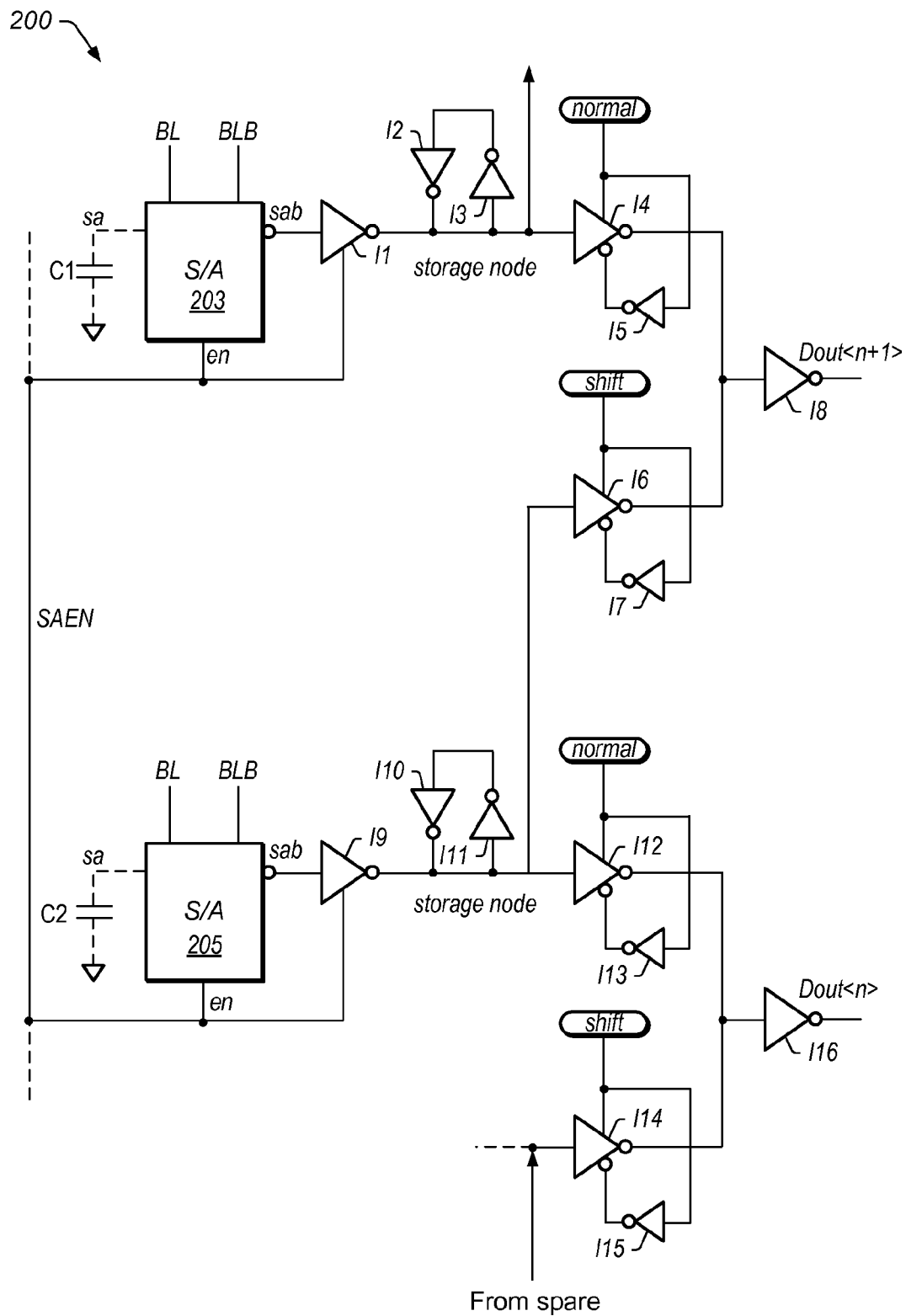
FIG. 2 is a block diagram of one embodiment of a conventional redundancy repair mechanism.
Figure 3:
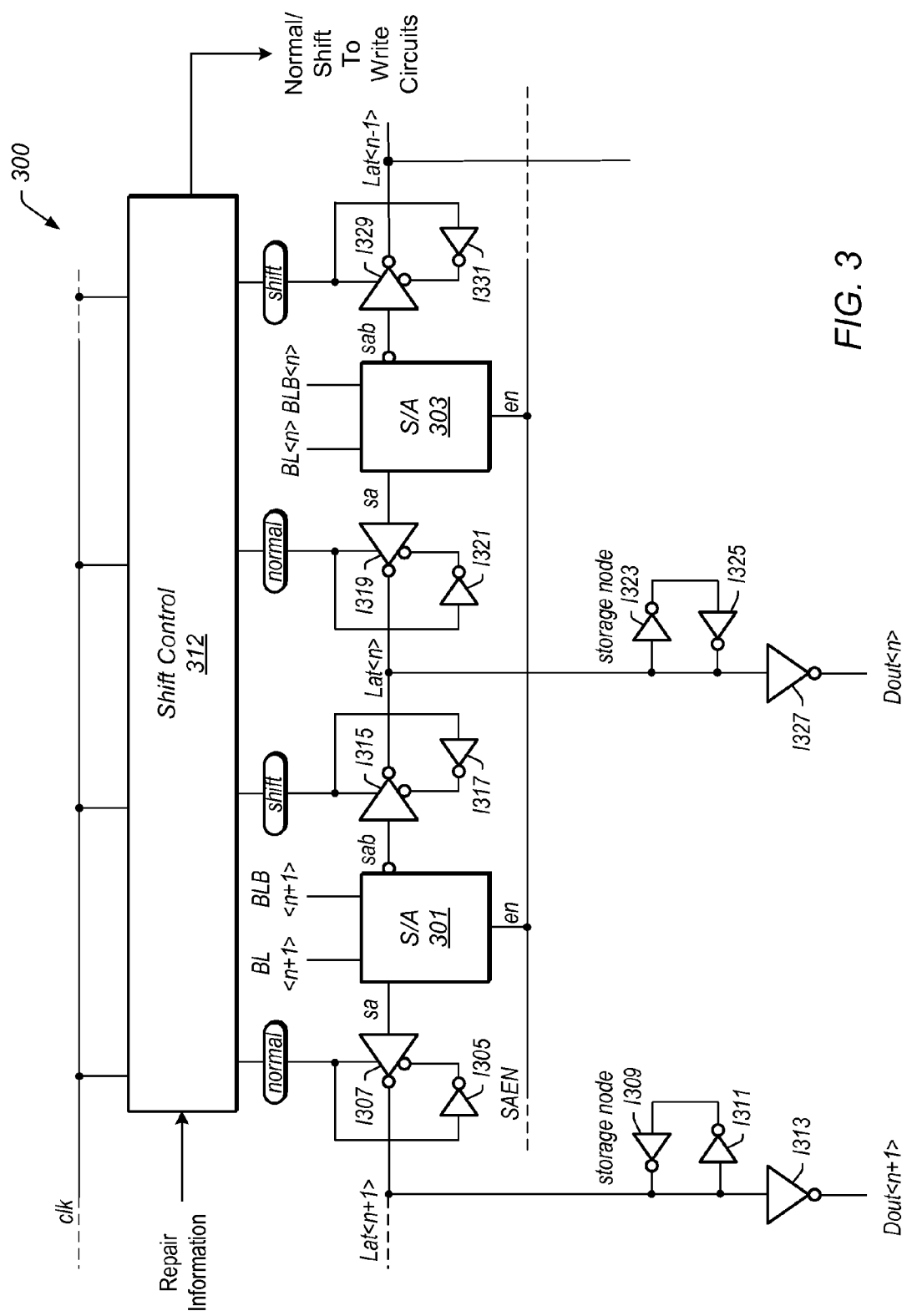
FIG. 3 is a block diagram of another embodiment of a redundancy repair mechanism of the memory of FIG. 1.

Referring to FIG. 2, a block diagram of one embodiment of a conventional redundancy repair mechanism is shown. The redundancy mechanism 200 includes a sense amplifier 203 coupled to a sense amp enable signal (SAEN). The un-complemented "sa" output of the sense amplifier 203 is coupled to a capacitive load C1, while the complemented "sab" output is coupled to an input of an inverter I1. The output of inverter I1 is coupled to an input of inverter I3, an output of inverter I1, and an input of inverter I4. The output of inverter I4 is coupled to the input of inverter I8, which provides the data output for the output port of the memory. In addition, the inverter I4 has an enable. Accordingly, the normal signal is coupled to the enable input of the inverter I4 and to an input of an inverter I5, the output of which is coupled to the enable bar input of the inverter I4. As shown there is a substantially identical sense amplifier circuit below the sense amplifier circuit just described which includes sense amplifier 205, and inverters I9, I10, I11, I12, I13 and I16. In addition, inverters I6 and I7 are coupled such that the input of inverter I6 is coupled to the output of sense amplifier 205, and the output of inverter I6 is coupled in a wire-OR configuration to the input of the inverter I8. The inverter I6 also has an enable. However, the enable for inverter I6 is coupled to the Shift signal, rather than the Normal signal. A similar circuit (e.g., I14 and I15) is shown coupled to the input of inverter I16.

In the illustrated embodiment, the sense amplifiers 203 and 205 are differential amplifiers. Accordingly, the sense amplifiers receive data from the bit cells of the memory array in the column with which the sense amplifier is associated via differential bit lines bit line (BL) and bit line bar (BLB). Similarly, the sense amplifiers output the data differentially as a sense amp output (sa) and sense amp output bar (sab). However as mentioned above, the data output is used as a single-ended output. Accordingly, the complemented sab output goes through three inversion stages to both shape and correct the polarity of the data.

It is noted that the capacitive loads (e.g., C1 and C2) shown in FIG. 1 are shown as capacitors, but as indicated by the dashed lines, in practice these capacitors may be transistors that are used to construct other components such as inverters I1 and I9, for example.

As shown, during normal operation, the inverters I4 and I12 are enabled through an asserted Normal signal, while the inverters I6 and I14 are not enabled and may be held in a high impedance state because the Shift signal is not asserted. Accordingly, the sense amplifier outputs are provided through the normal path to their respective Dout ports. However, during a repair event, one or both Shift signals may be asserted depending on which column is failing, and the corresponding Normal signals may be deasserted. For example, in response to an asserted Shift signal being applied to the inverter I6, and a deasserted Normal signal to inverter I4 and I12, the output of the sense amplifier 205 would be routed to output Dout<n+1>.

Accordingly, regardless of whether there is a Normal or Shift asserted, the number of gate delays from sense amplifier to the Dout port is four. The four delays are as follows: sense amplifier, and three inverter stages. As will be described in greater detail below in conjunction with the description of FIG. 3, the other sense amplifier output "sa" may be used during Normal mode, and the complemented output "sab" may be used during a shift. This may reduce the latency by one gate delay since in that configuration, one of the inverter stages may be removed.

Turning to FIG. 3, a block diagram of another embodiment of a redundancy repair mechanism of the memory of FIG. 1 is shown. The redundancy mechanism 300 includes a sense amplifier 301 coupled to a sense amp enable signal (SAEN). The un-complemented "sa" output of the sense amplifier 301 is coupled to an input of an inverter I307. The output of inverter I307 is coupled to an input of inverter I311, an output of inverter I309, and an input of inverter I313. The output of inverter I4 provides the data output Dout<n+1>. The complemented "sab" output of sense amplifier 301 is coupled to an input of an inverter I315. The output of inverter I315 is coupled to an input of inverter I323, an output of inverter I325, and an input of inverter I327. The output of inverter I327 provides the data output Dout<n> for the output port of the memory. In addition, the inverters I307 and I315 are enabled by the Normal and Shift signals, respectively, which are provided by the shift control unit 312. As shown there is a substantially identical sense amplifier circuit to the right, which includes sense amplifier 303, and inverters I319, I321, I329, and I331. However, as shown, the complemented output "sab" of sense amplifier 301 shares the Dout<n> output port with the uncomplemented normal output of sense amplifier 303 in a wire OR configuration. It is noted that in one embodiment, the shift control unit 312 corresponds to the shift control unit 12 of FIG. 1.

In one embodiment, when the Normal signal is asserted and the Shift signal is not, the output select circuitry, which includes the inverters I305, I307, I315, and I317 is configured to pass the "sa" output of the sense amplifiers 301 and 303. Alternatively, when the Normal signal is deasserted and the Shift signal is asserted, the output select circuitry is configured to pass the "sab" output of the sense amplifiers 301 and 303. Accordingly, during a repair, the output of certain selected columns is shifted to the respective adjacent columns. For example, the spare column (e.g. SP in FIG. 1) is shifted to the adjacent data output port of the adjacent column. Depending on which column is being repaired, all columns from the spare to that column would be shifted, and the columns before the column being repaired would not be shifted. Another way of stating it is to say that the data ports form a data element having a number of bits that are ordered from lowest to highest. In one embodiment, the columns having a higher order than the column being repaired will be shifted, and the columns having a lower order than the column being repaired will not be shifted. Thus, the output selection unit selects as the data bit for a given data port either the "sa" output signal of the sense amplifier that is associated with the given data port or the complemented "sab" output signal of the sense amplifier associated with an adjacent data port.

However, in the case of a shift, it appears that there is a polarity conflict at the data output port since the "sab" and "sa" outputs are wire OR-ed together. To alleviate this conflict, the that is written into the bit cells may be inverted during the write operation. As described in greater detail below in conjunction with the description of FIG. 4 and FIG. 5, the shift control unit 312 may generate a Shift signal and a Normal signal for use by the write control circuits. Thus, in one embodiment once a column output is going to be shifted, the Shift signal may stay asserted and may be used in the write control for the affected bit cells of that column, and the write data may be inverted.

As shown in FIG. 3, regardless of whether there is a Normal or Shift signal asserted, the number of gate delays from sense amplifier to the Dout port is three. The three delays are as follows: sense amplifier, and two inverter stages. This is a reduction of one gate delay in the critical output data path.

Figure 4:
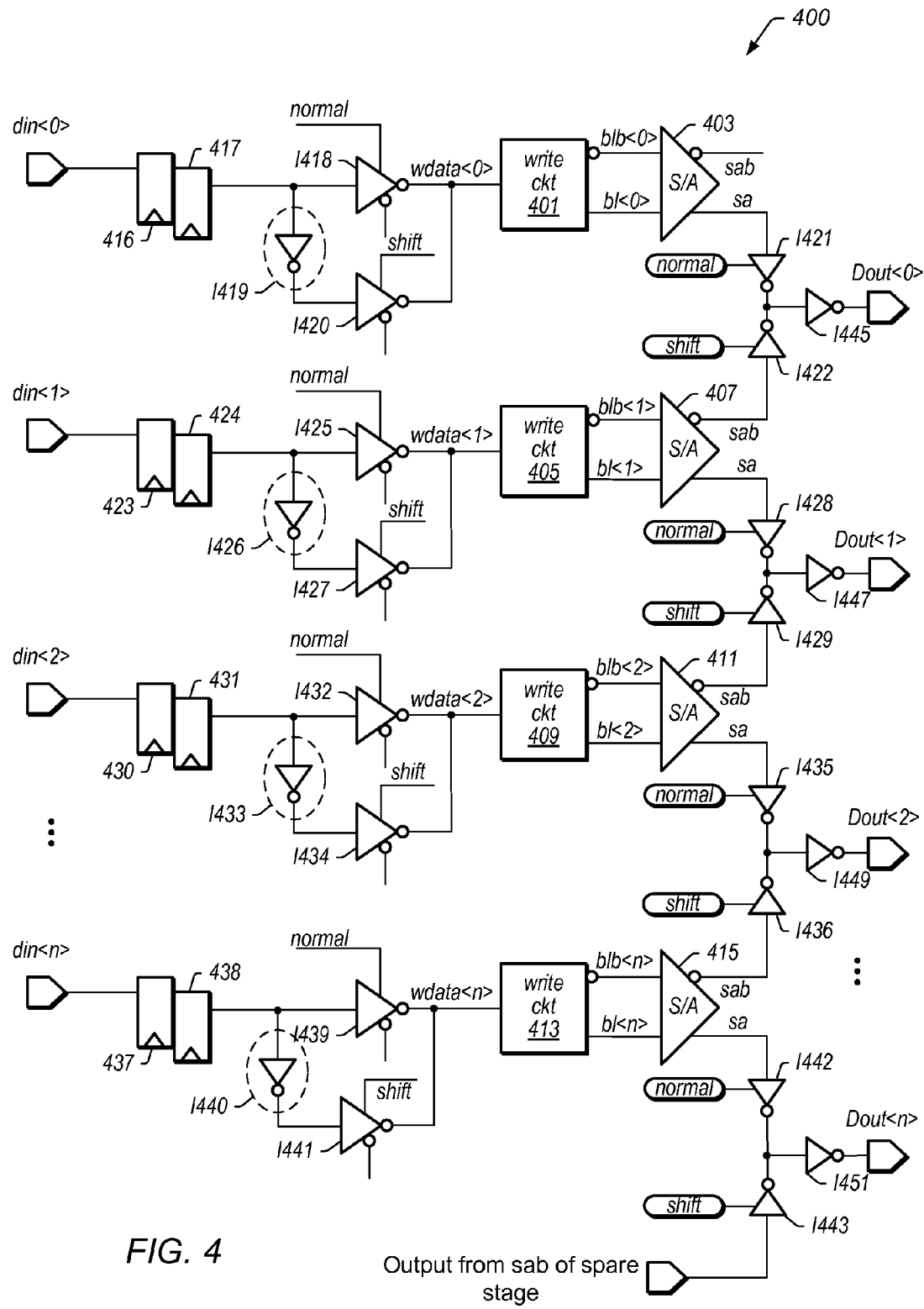
FIG. 4 is simplified block diagram of an embodiment of a memory write mechanism of the redundancy repair mechanism of FIG. 3.

Turning to FIG. 4, a simplified block diagram of an embodiment of a memory write mechanism of the redundancy repair mechanism of FIG. 3 is shown. The memory write mechanism 400 includes memory column data paths designated 0 through n. More particularly, beginning with the top column, the data path includes a data input port or Din<0>, which is coupled to a pair of flip flops (e.g., 416 and 417) which are in turn coupled to the input of an inverter I418, and an inverter I419. The output of inverter I418 is coupled to the input of write circuit 401. The output of the write circuit 401 is a differential bit line pair (e.g., bl<0>, and blb<0>) that is coupled to the input of the sense amplifier 403. The uncomplemented output of sense amplifier 403 is coupled to the input of an inverter I421, the output of which is coupled to the input of inverter I445, which provides the output for the output port. The output of inverter I419 is coupled to the input of inverter I420, the output of which is coupled back to the input of the write circuit 401. The enables of the inverters I418 and I420 are also coupled to the Normal signal and the Shift signal, respectively. It is noted that the output of the inverter 422 is coupled to the input of inverter I445 in a wire OR configuration similar to the configuration shown in FIG. 3. The input of inverter I422 is the complemented output "sab" of sense amplifier 407.

The three additional column data paths are substantially identical to datapath 0. Accordingly, those datapaths include write circuits 405, 409, and 413, sense amplifiers 403, 407, 411, and 415, flip-flops 423, 424, 430, 431, 437, and 438, inverters I425 through I429, inverters I432 through I436, inverters I439 through I443, and inverters I447, I449, and I451. It is noted that the last output Dout<n> is coupled to the spare column output through the inverter I443. It is also noted that the write circuits 401, 405, 409, and 413 may be representative of the wordline circuitry and the bit cells associated with their respective columns.

In one embodiment, when the Shift signal is asserted and the Normal signal is deasserted in a given column, in addition to the output selection unit selecting the complemented sense amplifier output "sab" as described above, the data input is selected such that the write data is inverted by the inverter shown in the dashed ellipse. For example, in data path Din<0>, the asserted Shift signal enables the inverter I420, and then deasserted Normal signal disables the inverter I418. Accordingly the data is inverted by the inverter I419 and is written as inverted data into the write circuit 401. Then, when the data is subsequently read out, the Shift signal is asserted and the complemented sense amplifier output "sab" is selected, and the data is inverted again to produce the data bit with the correct polarity.

It is noted that a gate delay was removed in the output circuit as shown in FIG. 3, and an extra gate was added at the input. However, the data output path is the critical timing path in the memory, and not the data input path. Thus, the reduced latency at the output may be a noticeable improvement, while the additional delay at the input may not be. As shown in the timing diagram of FIG. 5, the write data is typically known well in advance of the write enable signal, and any additional delay may be absorbed by the setup time between the data stabilizing and the write enable signal.

Figure 5:
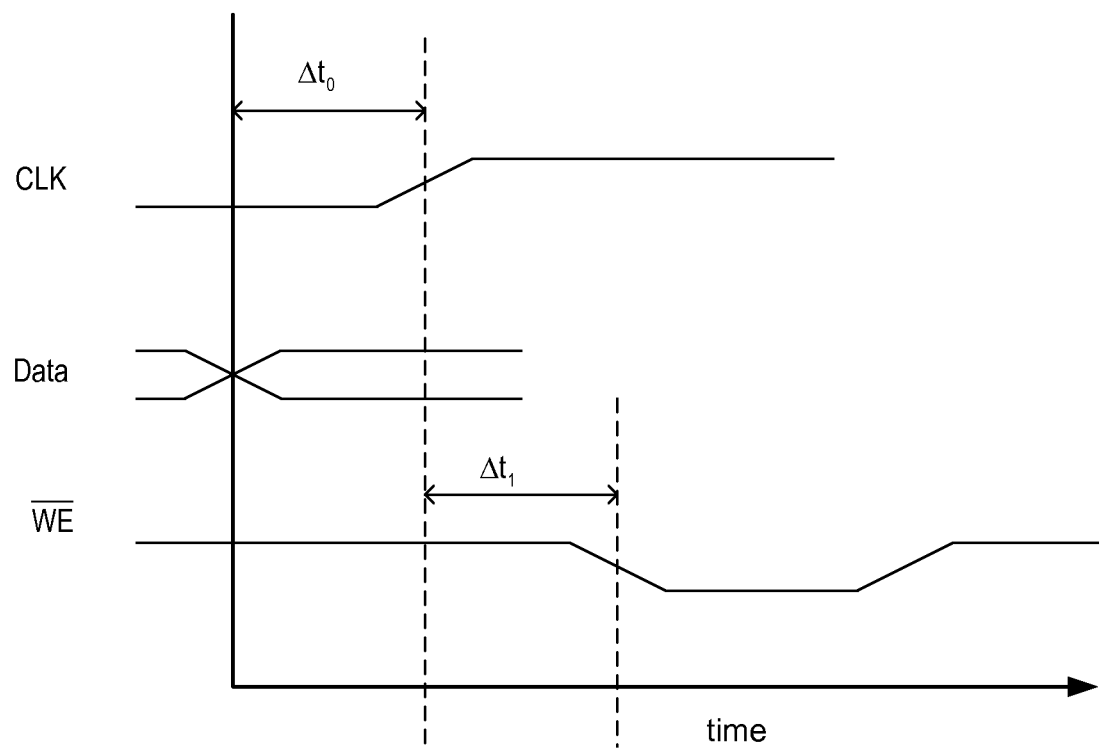
FIG. 5 is a timing diagram depicting operational timing of a write operation of the embodiment of the redundancy repair mechanism of FIG. 3 and FIG. 4.

Referring to FIG. 5, a timing diagram depicting operational timing of a write operation of the embodiment of the memory of FIG. 3 and FIG. 4 is shown. The timing diagram includes a clock signal (e.g., CLK), data, and a write enable signal $\overline{WE}$. As shown, the data is known in advance of the CLK signal by an amount $\Delta t_0$. In addition, there is additional setup time before the write enable signal from the CLK edge to the edge of $\overline{WE}$. Thus, the additional delay caused by the extra inverter is easily absorbed by this setup time.

Figure 6:
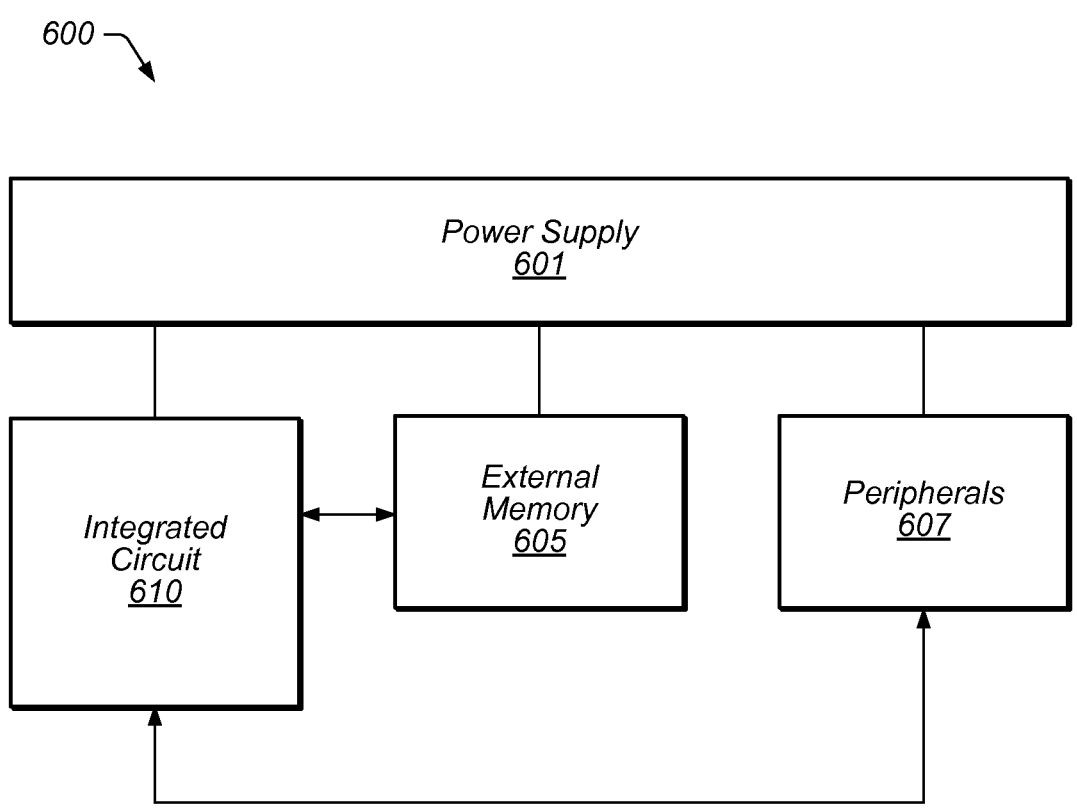
FIG. 6 is a block diagram of one embodiment of a system.

Turning to FIG. 6, a block diagram of one embodiment of a system is shown. The system 600 includes at least one instance of an integrated circuit 610 coupled to one or more peripherals 607 and an external system memory 605. The system 600 also includes a power supply 601 that may provide one or more supply voltages to the integrated circuit 610 as well as one or more supply voltages to the memory 605 and/or the peripherals 607.

In one embodiment, the integrated circuit 610 be a system on a chip including one or more instances of a processor and various other circuitry such as a memory controller, video and/or audio processing circuitry, on-chip peripherals and/or peripheral interfaces to couple to off-chip peripherals, etc. More particularly, the integrated circuit 610 may include one or more instances of a memory or cache memory such as memory 10 from FIG. 1.

The peripherals 607 may include any desired circuitry, depending on the type of system. For example, in one embodiment, the system 600 may be included in a mobile device (e.g., personal digital assistant (PDA), smart phone, etc.) and the peripherals 607 may include devices for various types of wireless communication, such as WiFi, Bluetooth, cellular, global positioning system, etc. The peripherals 607 may also include additional storage, including various types of RAM storage, solid-state storage, or disk storage. As such, the peripherals 607 may also include SRAM that includes the redundancy repair mechanism described above. The peripherals 607 may include user interface devices such as a display screen, including touch display screens or multitouch display screens, keyboard or other input devices, microphones, speakers, etc. In other embodiments, the system 600 may be included in any type of computing system (e.g. desktop personal computer, laptop, workstation, net top etc.).

The external system memory 605 may include any type of memory. For example, the external memory 605 may be in the DRAM family such as synchronous DRAM (SDRAM), double data rate (DDR, DDR2, DDR3, etc.), or any low power version thereof. However, external memory 605 may also be implemented in SDRAM, static RAM (SRAM), or other types of RAM, etc. In embodiments implemented in SRAM, external memory 605 may be implemented with the redundancy repair mechanism described above.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory device comprising:
    a plurality of data output ports each configured to output one data bit of a data element;
    a plurality of memory columns each coupled to a corresponding respective data port, wherein each memory column includes a plurality of bit cells coupled to a corresponding sense amplifier, wherein each sense amplifier is configured to differentially output a respective data bit from the plurality of bit cells on an output signal and a complemented output signal; and
    an output selection circuit coupled to each of the sense amplifiers and configured to select as the output data bit for a given data output port, one of the output signal of the sense amplifier associated with the given data output port or the complemented output signal of the sense amplifier associated with an adjacent data output port dependent upon a respective shift signal for each memory column.

2. The memory device as recited in claim 1, further comprising a plurality of data inversion circuits, each coupled to a respective bit cell of each memory column, wherein each data inversion circuit is configured to invert a polarity of the data bit written to the respective bit cell in response to receiving an asserted shift signal.

3. The memory device as recited in claim 1, wherein in response to receiving an asserted shift signal the output selection circuit is configured to select the complemented output signal of the sense amplifier associated with the adjacent data port.

4. The memory device as recited in claim 1, wherein the output selection circuit is configured to output each data bit through an even number of inverter stages regardless of which of the output signal or the complemented output signal is selected.

5. The memory device as recited in claim 4, wherein the number of inverter stages is two.

6. The memory device as recited in claim 1, further comprising a shift control circuit coupled to the output selection circuit and configured to generate the respective shift signal for each memory column based upon failure information corresponding to the plurality of memory columns.

7. The memory device as recited in claim 1, further comprising a redundant memory column including a plurality of bit cells coupled to a corresponding sense amplifier, wherein the output selection circuit is configured to select the complemented output signal of the sense amplifier of the redundant memory column as the output data bit for the adjacent data output port in response to an asserted shift signal.

8. A memory comprising:
    a plurality of memory columns each providing a data output bit to form a data element;
    a redundant memory column configured to provide a data output bit of the memory in response to a failure of one or more bit cells of a given one of the plurality of memory columns;
    wherein the plurality of memory columns and the redundant memory column each include a plurality of bit cells coupled to a corresponding sense amplifier;
    wherein each sense amplifier is configured to differentially output the data bit from the corresponding bit cell on a sense amplifier output signal and a complemented sense amplifier output signal; and
    an output selection unit coupled to each of the sense amplifiers and configured to select one of the sense amplifier output signal or the complemented sense amplifier output signal as the data output bit for each column dependent upon whether one or more bit cells in the given one of the plurality of memory columns is failing.

9. The memory as recited in claim 8, wherein the data output bits of the data element are ordered from lowest to highest, and wherein in response to receiving repair information indicating that the one or more bit cells within the given one of plurality of memory columns is failing, the output selection unit is configured to select the complemented sense amplifier output signal of a next higher ordered column as the data output bit for the given column, and to select the sense amplifier output signal as the data output bit for each lower ordered column.

10. The memory as recited in claim 8, further comprising a shift control circuit coupled to the output selection circuit and configured to receive and decode failure information indicative of which memory column has failing bit cells, and to assert a respective shift signal for selecting the sense amplifier output signal or the complemented sense amplifier output signal as the data output bit for the redundant memory column and a subset of the plurality of memory columns.

11. The memory as recited in claim 10, wherein each of the plurality of memory columns and the redundant memory column include a data inversion circuit configured to, in response to receiving an asserted respective shift signal, invert a polarity of the data bit being written to the corresponding bit cell.

12. The memory as recited in claim 10, wherein the respective shift signal is asserted for both writes and reads of bit cells within the redundant memory column and a subset of the plurality of memory columns in response to receiving information that indicates one or more bit cells in a given one of plurality of memory columns is failing.

13. A system comprising:
a memory; and
one or more processors coupled to the memory, wherein at least one of the one or more processors includes a cache memory;
wherein the cache memory includes:
a plurality of data output ports each configured to output one data bit of a data element;
a plurality of memory columns each coupled to a corresponding respective data port, wherein each memory column includes a plurality of bit cells coupled to a corresponding sense amplifier, wherein each sense amplifier is configured to differentially output a respective data bit from the plurality of bit cells on an output signal and a complemented output signal; and
an output selection circuit coupled to each of the sense amplifiers and configured to select as the output data bit for a given data output port, one of the output signal of the sense amplifier associated with the given data output port or the complemented output signal of the sense amplifier associated with a next data port dependent upon a respective shift signal for each memory column.

14. The system as recited in claim 13, wherein the cache memory includes a redundant memory column including a plurality of bit cells coupled to a corresponding sense amplifier, wherein the output selection circuit is configured to select the complemented output signal of the sense amplifier of the redundant memory column as the output data bit for a next lower data output port in response to an asserted respective shift signal.

15. The system as recited in claim 14, wherein the cache memory includes a shift control circuit coupled to the output selection circuit and configured to assert the respective shift signal for each memory column based upon failure information corresponding to the plurality of memory columns.

16. The system as recited in claim 14, wherein each of the plurality of memory columns and the redundant memory column include a plurality of data inversion circuits, each coupled to a respective bit cell, wherein each data inversion circuit is configured to invert a polarity of the data bit written to the respective bit cell in response to receiving an asserted shift signal.

17. A method comprising:
outputting a respective data bit of a data element on each of a plurality of data output ports of a memory;
each sense amplifier of a memory column of the memory differentially outputting a respective data bit as an output signal and a complemented output signal; and
selecting as the output data bit for a given data output port, one of the output signal of the sense amplifier associated with the given data output port or the complemented output signal of the sense amplifier associated with a next data output port dependent upon failure information that is indicative of whether one or more bit cells in one of the memory columns has failed.

18. The method as recited in claim 17, further comprising selecting the complemented output signal of the sense amplifier associated with the next data port in response to receiving an asserted shift signal.

19. The method as recited in claim 17, further comprising inverting a polarity of the data bit written to the respective bit cell in response to receiving an asserted shift signal.

20. A mobile communication device comprising:
a memory,
a processor coupled to the memory, wherein the processor includes a cache memory including:
a plurality of data output ports each configured to output one data bit of a data element;
a plurality of memory columns each coupled to a corresponding respective data port, wherein each memory column includes a plurality of bit cells coupled to a corresponding sense amplifier, wherein each sense amplifier is configured to differentially output a respective data bit from the plurality of bit cells on an output signal and a complemented output signal; and
an output selection circuit coupled to each of the sense amplifiers and configured to select as the output data bit for a given data output port, one of the output signal of the sense amplifier associated with the given data output port or the complemented output signal of the sense amplifier associated with a next data output port dependent upon a respective shift signal for each memory column.

21. The mobile communication device as recited in claim 20, wherein the shift signal is indicative that one or more bits of a memory column have failed, and wherein in response to an asserted shift signal the output selection circuit is configured to select the complemented output signal of the sense amplifier associated with a next data output port.

22. The mobile communication device as recited in claim 20, wherein each of the plurality of memory columns and a redundant memory column include a plurality of data inversion circuits, each coupled to a respective bit cell, wherein each data inversion circuit is configured to invert a polarity of the data bit written to the respective bit cell in response to receiving an asserted respective shift signal.

* * * * *